United States Patent
Arias

(10) Patent No.: US 7,300,861 B2
(45) Date of Patent: Nov. 27, 2007

(54) METHOD FOR INTERCONNECTING ELECTRONIC COMPONENTS USING A BLEND SOLUTION TO FORM A CONDUCTING LAYER AND AN INSULATING LAYER

(75) Inventor: Ana C. Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 10/875,480

(22) Filed: Jun. 24, 2004

(65) Prior Publication Data

US 2005/0287781 A1 Dec. 29, 2005

(51) Int. Cl.
*H01L 21/44* (2006.01)
(52) U.S. Cl. .................. 438/597; 438/99; 438/197; 257/E21.041; 257/E21.575
(58) Field of Classification Search ............... 438/597, 438/99, 780, 200, 285, 21; 257/E21.041
See application file for complete search history.

(56) References Cited

U.S. PATENT DOCUMENTS

| | | | | |
|---|---|---|---|---|
| 3,683,396 | A * | 8/1972 | Robert et al. ................. 347/75 |
| 5,213,715 | A * | 5/1993 | Patterson et al. ............ 252/514 |
| 5,872,205 | A * | 2/1999 | Balke et al. ............. 528/502 F |
| 6,107,117 | A * | 8/2000 | Bao et al. ..................... 438/99 |
| 6,326,936 | B1 * | 12/2001 | Inganas et al. ................ 345/55 |
| 6,359,672 | B2 * | 3/2002 | Gu et al. ...................... 349/138 |
| 6,503,831 | B2 * | 1/2003 | Speakman ................... 438/674 |
| 2002/0040805 | A1 * | 4/2002 | Swager .................... 174/110 A |
| 2002/0119584 | A1 * | 8/2002 | Duthaler et al. ............... 438/21 |
| 2003/0071246 | A1 * | 4/2003 | Grigorov et al. ............ 252/500 |
| 2003/0138566 | A1 * | 7/2003 | Pron et al. ............... 427/385.5 |
| 2003/0157244 | A1 * | 8/2003 | Kawase ....................... 427/58 |
| 2003/0161959 | A1 * | 8/2003 | Kodas et al. ............. 427/376.2 |
| 2004/0227891 | A1 * | 11/2004 | Hirota ......................... 349/141 |
| 2005/0045855 | A1 * | 3/2005 | Tonapi et al. ............... 252/500 |
| 2005/0078099 | A1 * | 4/2005 | Amundson et al. .......... 345/204 |
| 2005/0151820 | A1 * | 7/2005 | Sirringhaus et al. ........ 347/107 |
| 2005/0287728 | A1 * | 12/2005 | Arias .......................... 438/197 |

FOREIGN PATENT DOCUMENTS

JP 01234435 A * 9/1989
WO WO 9630914 A1 * 10/1996

* cited by examiner

*Primary Examiner*—B. William Baumeister
*Assistant Examiner*—Igwe U. Anya
(74) *Attorney, Agent, or Firm*—Kent Chen

(57) ABSTRACT

An improved method of interconnecting electronic devices is described. In the method a blended material for forming a conducting layer and an insulating layer are deposited between a contact of a first electronic device and a second electronic device. The blended material leads to formation of a conductor overlayed by an insulator such that after formation, the conductor is capable of carrying current from the first electronic device to the second electronic device and the insulator forms a protective layer over the conductor.

22 Claims, 5 Drawing Sheets

METHOD FOR INTERCONNECTING ELECTRONIC COMPONENTS USING A BLEND SOLUTION TO FORM A CONDUCTING LAYER AND AN INSULATING LAYER

STATEMENT REGARDING FEDERALLY SPONSORED RESEARCH OR DEVELOPMENT

This invention was made with U.S. Government support under Cooperative Agreement No. 70NANBOH3033 awarded by the National Institute of Standards and Technology (NIST). The U.S. Government has certain rights in the invention.

CROSS-REFERENCE TO RELATED APPLICATIONS

This application is related to patent application Ser. No. 10/876,229 entitled "Improved Method for Forming a Bottom Gate Thin Film Transistor Using a Blend Solution to form a Semiconducting Layer and an Insulating Layers" by the Same Inventor and filed on the same date.

BACKGROUND

Oxygen, humidity, light and heat amongst other environmental parameters, can damage polymeric materials. To minimize material degradation, polymer based electronic devices are often fabricated and tested under tightly controlled environmental conditions, typically in a "glove box" filled with an inert gas, or under vacuum conditions. Large scale fabrication under tightly controlled environments increases the cost of fabrication reducing commercialization opportunities.

Encapsulation of semiconducting and conducting polymers in fabricated devices minimizes environmental exposure and thus device degradation after fabrication. However, encapsulating polymeric layers is difficult because of polymeric layer incompatibility with the processes used in encapsulation. Many materials available for encapsulation utilize process steps that involve high temperatures or solvents that may damage the polymeric semiconductor. Light used when depositing solid encapsulating layers can also damage the polymeric layers.

Thus an improved non-destructive method for forming and encapsulating polymeric layers in electronic devices is needed.

SUMMARY

A method of interconnecting electronic devices is described. The method locates a contact of a first electronic device and the contact of a second electronic device. A blend solution is deposited between the first device contact and the second device contact. The blend solution includes a material designed to lead to formation of an insulator and a second material designed to lead to formation of a conductor such that after formation, the conductor forms a conducting line that carries current from the first electronic device to the second electronic device and the insulator forms a protective layer over the conductor.

DETAILED DESCRIPTION

A method to process and encapsulate polymer electronics is described herein. The method uses a polymer blend that is composed of both a semiconducting and an insulating polymer. After deposition, the polymer blend segregates, to form a polymeric semiconducting layer encapsulated by the insulating polymer. An example where this method can be used is to form polymer-based thin film transistors (TFT). Details of forming such a polymer TFT will be provided. However, many different devices may be formed using the described encapsulated semiconducting polymers, and the described invention should not be limited to any one device.

Figure 1:
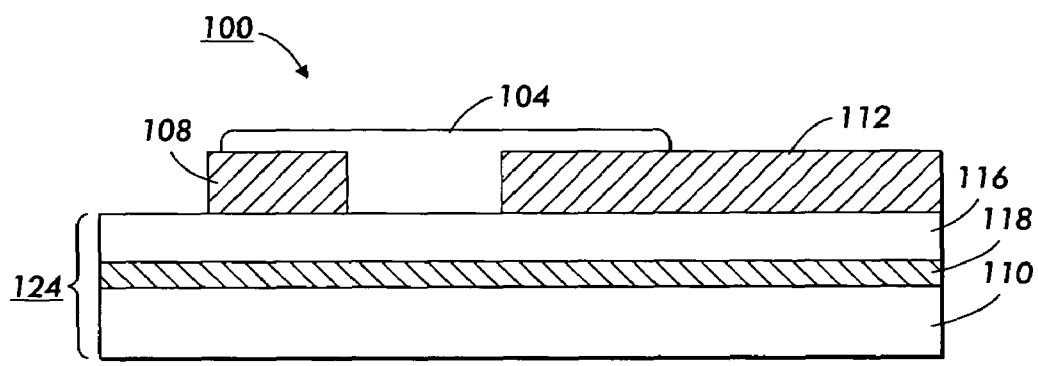
FIG. 1 shows one example of a bottom gate thin film transistor.

FIG. 1 shows a schematic of an example bottom gate polymeric TFT 100. The illustrated TFT includes a polymeric semiconducting layer 104 distributed between source 108 and drain 112. Polymeric semiconductor 104 is formed over a substrate, 116. In the illustration, the substrate is a dielectric layer 116. The substrate is formed over a gate line 120. During operation, charge placed on the gate line controls the conductivity of polymeric semiconductor 104. Thus the charge on gate line 120 controls current flow between drain 112 and source 108. Dielectric layer 116 together with gate line 120 form a base structure 124.

FIG. 2-5 show a process of using a polymer blend solution to form a bottom gate polymeric TFT that includes an encapsulated polymer semiconductor. In the final structure, an encapsulation layer precipitated from the polymer blend solution protects polymeric semiconductor 104. In one embodiment, the polymer blend solution includes a semiconducting polymer and an insulating polymer. As used herein, an insulating polymer is defined as a polymer that provides very high resistance to the passage of electric current. The insulating polymer and the semiconducting polymer are dissolved together in a common solvent.

Many different polymers may be used for the semiconducting polymer and insulating polymer. Examples of typical semiconducting polymers include polythiophenes such as poly(3-alkylthiophene) (P3AT), poly(3-n-hexylthiophene) (P3HT) and poly[5,5'-bis(3-dodecyl-2-thienyl)-2, 2'-bithiophene) (PQT-12) and polyfluorenes such as poly (fluorine-co-bithiophene) (F8T2) and poly(9,9'-dioctylfluorene-co-bis-N,N'-(4-butylphenyl)-bis-N,N'-phenyl-1,4-phenylenediamine) (TFB). Examples of typical insulating polymers that dissolve in solvents include poly-(methyl methacrylate) (PMMA) and poly(4-vinylphenol) (PVP). Example of typical monomer that that become polymers when annealed (hereinafter polymer precursors)

include benzocyclobutene (BCB). Typical solvents that may be used to dissolve the semiconducting polymer and the insulating polymer are organic solvents such as dichlorobenzene, xylene, chloroform, and mesitylene amongst others.

In an alternate embodiment, other materials may be substituted for the polymer insulator and polymer conductor. For example, the insulator may be formed from a precursor material that becomes an insulator after an annealing or curing process. Likewise, a precursor material that becomes a polymer semiconductor after an annealing or curing process may be in lieu of an actual dissolved polymer. In particular, polymer dielectric films can be obtained from deposition of prepolymer, also know as polymer precursors. The solution of a polymer precursor can contain monomers and oligomeners that when thermally treated, transforms into an insoluble polymer film. Examples of dielectric polymer obtained from deposition of precursors (amongst others) are: polyimides which are synthesized from two monomers, a dianhydride and a diamine. Some variations of polyimides have been synthesized with structural modifications on the dianhydride and a diamine monomers, with the inclusion of flexible bridge monomers, fluorinated and silicone monomers, and acetylene terminated polyimides. A different class of dielectric polymer are the polybenzocyclobutenes (PBCB) derived from the monomer bisbenzocyclobutene (BCB). Thermal polymerization of BCB precursor occurs around 250 C in an oxygen-free environment.

Figure 2:
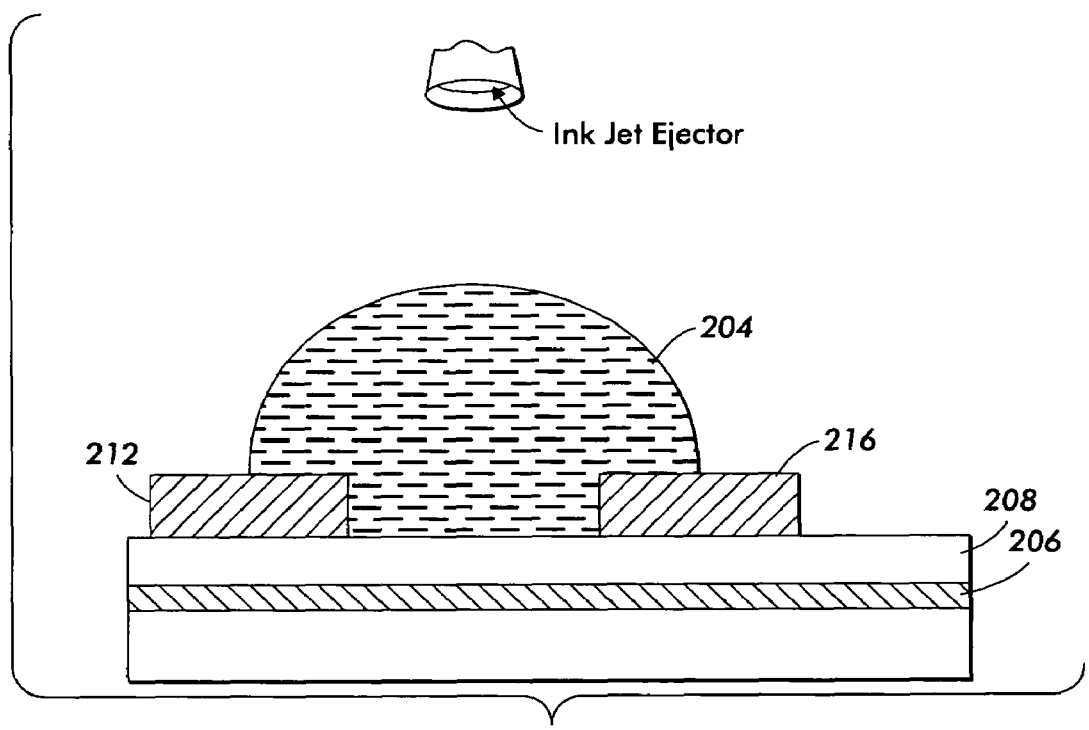
FIG. 2 shows the first step in forming the structure of FIG. 1 using a polymer blend in a liquid phase.

FIG. 2 shows depositing polymer blend solution 204 onto a base structure that includes gate line 206 and substrate 208. Polymer blend solution 204 is deposited between source 212 and drain 216. Source 212 and drain 216 may be formed using a variety of techniques including photolithographic techniques, jet deposition and other techniques known to those of skill in the art. During deposition, semiconducting polymer and insulating polymer are dissolved in a solvent to form a uniform liquid polymer solution. Typically, the polymer solution does not require heating and remains a liquid at room temperature (between 10 degrees and 50 degrees centigrade).

Different techniques may be used to deposit the blended polymer solution 204. Examples of deposition techniques include spin coating, drop casting, ink jet printing and dip coating. The deposition method used depends on several factors including the device to be fabricated and the viscosity of the polymer solution. For example, when jet printing the polymer solution, viscosity is typically maintained below 40 mPa.s and concentration of polymer/solvent may be adjusted to facilitate jetting conditions. When spin coating, higher concentration and higher viscosity polymer blend solutions may be used because film formation can be controlled by the spin coating speed and solvent evaporation rate.

Immediately after deposition but prior to solvent evaporation, the polymer blend solution is rich in solvent, and the molecules are highly mobile. This solution stage is often called the diffusion and liquid flow regime. The liquid flow regime is characterized by high molecular mobility of molecules in a blended polymer solution. The first stages of phase separation between the semiconducting polymer and the insulator occurs during the liquid flow regime. As used herein, phase separation is defined as the process from which different polymer molecules dissolved in a common solvent are repealed and spontaneously separated from each other forming distinct domains, phases, of the different polymers.

Figure 3:
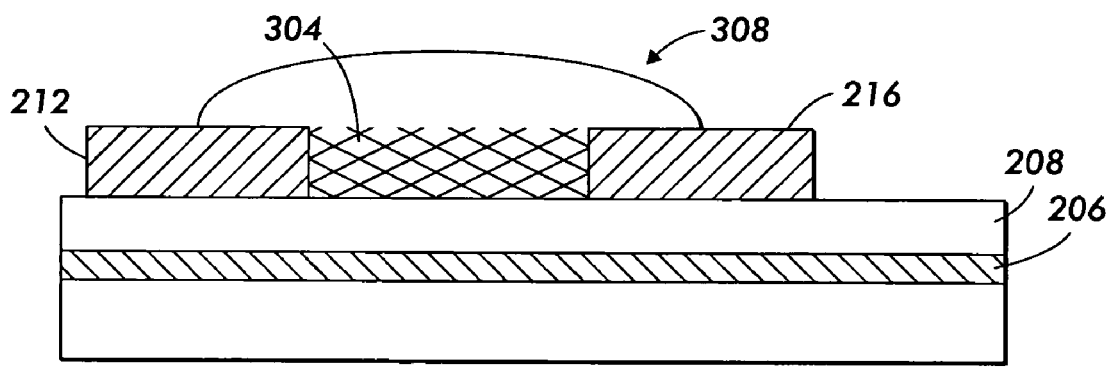
FIG. 3 shows the coalescence of the polymer blend allowing the formation of an insulating layer over the semiconducting layer.

FIG. 3 shows the polymer blend solution during a later stage of phase separation, often called coalescence stage. In the coalescence stage, molecular mobility is reduced due to reduced amount of solvent, but distinct domains are still being formed. At this stage, the composition and size of each domain is changing. In FIG. 3 the semiconducting polymer 304 in blended polymer solution 204 exits the blended polymer solution. Low molecular mobility of polymer blend solution molecules characterizes the coalescence phase. Separation of polymer solution constituent components is carefully controlled. As will be described, several methods may be used to control the separation, including carefully selecting the characteristics of the substrate, the solvent, the semiconducting polymer and the insulating polymer to form the desired structure.

One method of forming the structure of FIG. 3 involves selecting the substrate 208 and polymer solution compounds based on the surface energy of the substrate 308 and polymer interactions with the substrate 308. In particular, the substrate surface energy and the materials are chosen so that the semiconducting polymer 304 has an affinity to the substrate resulting in better wettability conditions than that of the insulating material to the substrate. In the described example, the insulating material would segregate to the top surface, forming a double layer structure. Alternatively, a substrate surface energy and an insulating material may be chosen such that the insulating material preferentially wets the semiconducting polymer and not to substrate 208. Thus ordering and formation of the polymer layers is partially controlled by wetting characteristics of one polymer to the other and wetting characteristics of each polymer to the substrate surface.

Different techniques may be used to adjust the interaction between polymers and between polymer and substrate. In order to adjust the interaction between substrate and polymer, the substrate surface energy may be modified. Techniques of modifying substrate surface energy include, but not limited to, plasma treatment, deposition of self assembled monolayer from solution, stamping of fluorinated hydrocarbon-terminated thiol or COOH-terminated thiol. The same end-terminated monolayer can be created with other attachment chemistries, including silylation-based monolayers.

A third method of controlling double layer formation uses a combination of materials where the semiconducting polymer and an insulating material are selected such that the two polymers exhibit different solubility in the common solvent. In the present example the bottom layer material solubility is lower than top layer material solubility. In the illustrated example, the bottom layer material is semiconducting polymer 304. Insulating polymer 308 forms the top layer material. After deposition, the solute gradually evaporates causing the semiconducting polymer 304 to leave the solution before the higher solubility insulating polymer. When additional solvent evaporates, insulating polymer 308 also saturates and precipitates out of solution resulting in the formation of insulating polymer 308 over semiconducting polymer 304.

Figure 4:
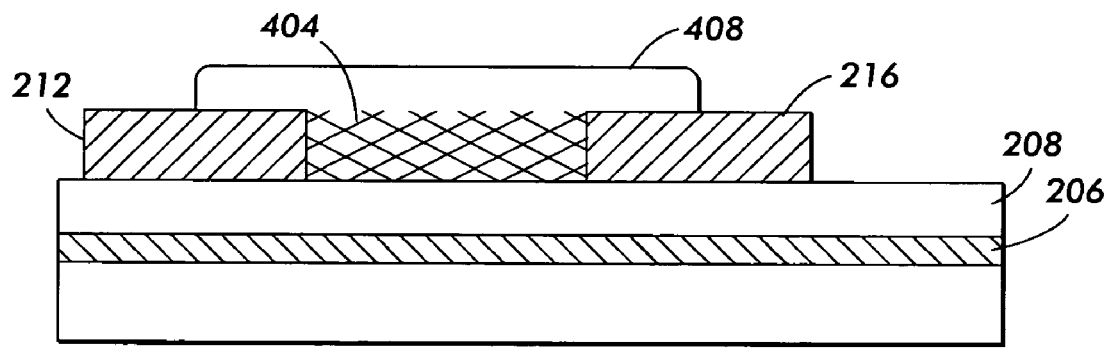
FIG. 4 shows the finally separated thin film and the final polymer semiconductor protected by a polymer insulator in a bottom gate TFT.

FIG. 4 shows the bottom gate TFT after final separation of semiconducting polymer 404 from the insulating polymer 408. In FIG. 4, the solvent has evaporated. The time it takes for the solvent to leave the film is often called transformation time. The removal of the solvent from the polymer blend is controlled to maintain sufficient transformation time to enable full separation of the semiconducting polymer and the insulator. In order to extend the time in the diffusion and liquid flow regime, high boiling point solvents are often used. High boiling point solvents have slower solvent evaporation rate. Example solvents are organic solvents with boiling points in excess of 60 degrees centigrade. A typical solvent that fits those characteristics is dichlorobenzene. Typical solvent evaporation times are from one to six minutes after deposition.

The transformation time can also be increased by altering processing techniques; thus the use of the method described is not limited to high boiling point solvents. A second way of controlling evaporation rate is to create a solvent enriched atmosphere which slows down the solvent evaporation rate. One method of achieving a solvent rich atmosphere is to provide a solvent reservoir in a common sealed environment with the blend solution. Use of a solvent rich atmosphere is particularly well suited to spin coating and drop casting deposition methods.

After solvent evaporation, a film of semiconducting polymer 304 remains in contact with dielectric layer 220. The example illustrated structure is a bottom gate TFT. In a TFT, the semiconducting polymer film acts as a switch that controls current flow between source 212 and drain 216 according to a voltage applied to gate line 224. Polymeric semiconductors usually behave as a p type semiconductor. In a P type semiconducting polymer film, when no voltage is applied to gate line 224, the semiconducting polymer film prevents the flow of current between source 212 and drain 216. When a voltage is applied to gate line 224, the p type semiconducting polymer film allows current to flow between source 212 and drain 216.

In FIG. 4, insulating polymer 408 encapsulates the semiconducting polymer 404 minimizing device degradation by reducing environmental exposure. The encapsulation improves the long term performance of the semiconducting polymer and also allows further devices to be deposited over the gate region of the thin film transistor.

Figure 5:
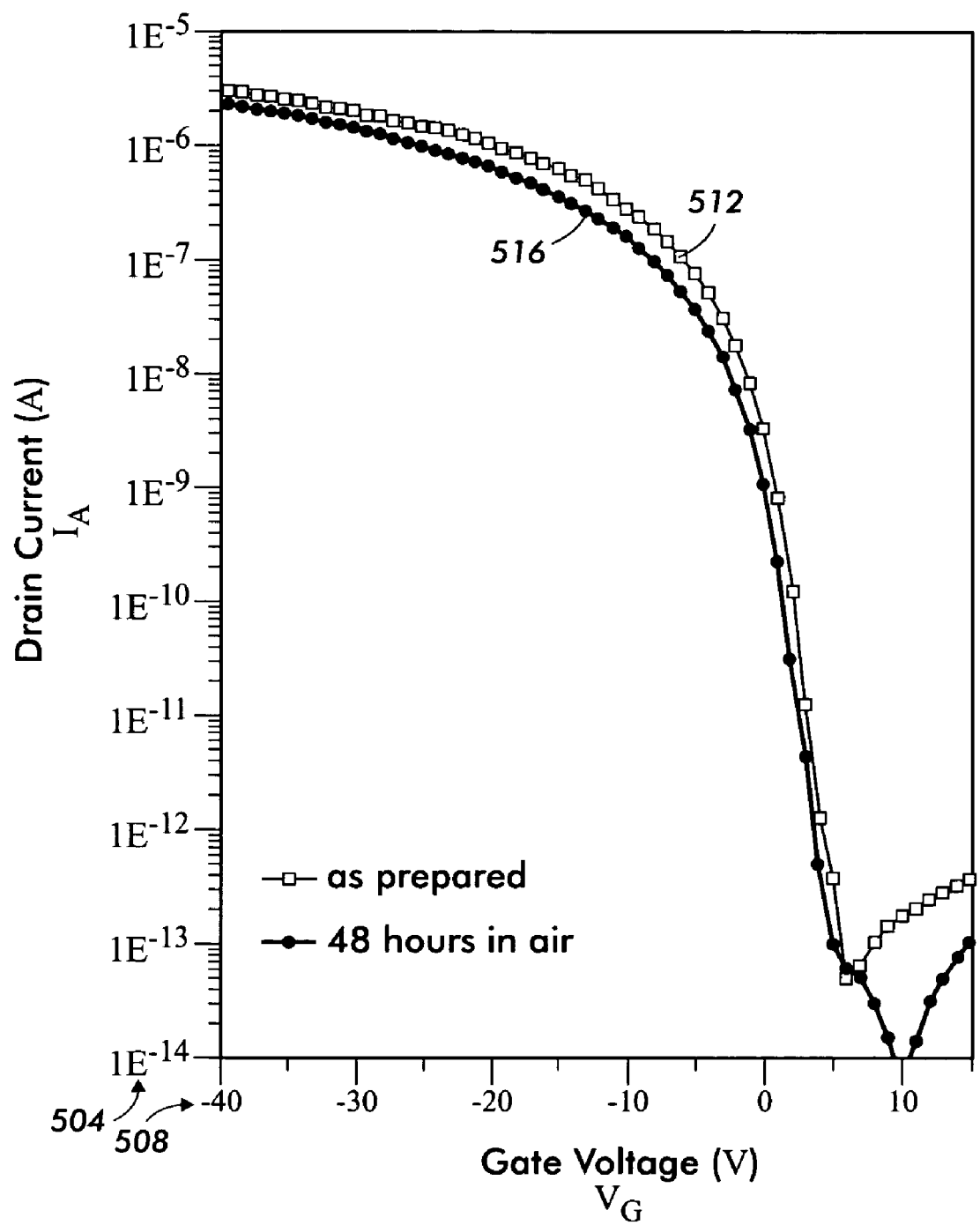
FIG. 5 shows the transfer characteristic of a TFT formed from the described structure left in air.

FIG. 5 shows an approximate transfer characteristic of a TFT of the type shown in FIG. 4. The drain current is provided on a vertical axis 504 and the gate voltage is shown along horizontal axis 508. A first plot 512 shows the transfer characteristic immediately after fabrication and a second plot 516 shows the device characteristic 2 days after fabrication. As can be seen, the similar performance shows minimal changes after two days suggesting that the insulating polymer effectively minimizes degradation of the semiconducting polymer by encapsulating the semiconducting polymer.

Figure 6:
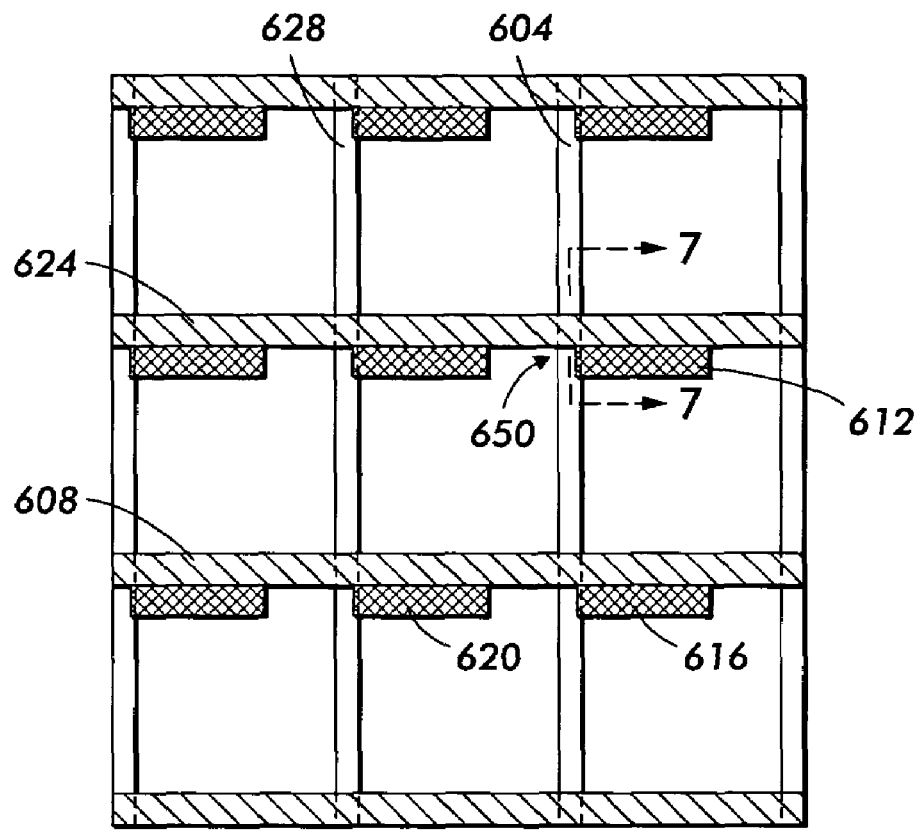
FIG. 6 shows a top view of an electronic circuit that uses interconnect lines formed by segregating a semiconducting polymer from an insulating polymer.
Figure 8:
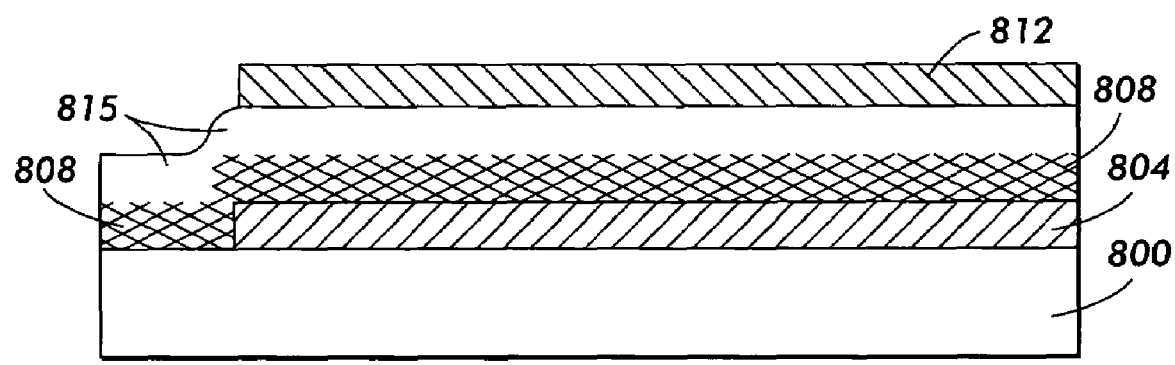
FIG. 8 shows a diode including a semiconducting polymer and an electrode contact formed using a blended polymer.

Although the preceding description has been provided in terms of a TFT, the use of a polymer blend to create an insulating layer that encapsulates a circuit element may be used in a variety of electronic devices. The encapsulation may be used to environmentally isolate the circuit element as previously described or the encapsulation may be used to electrically isolate the circuit element to allow for circuit element stacking. For example, an insulator may be blended with a conducting polymer or with a metal colloidal dispersion to form a double layer film. The double layer film includes a conducting layer and a non-conducting layer. FIG. 6 shows using a conducting and non-conducting blend to fabricate stacked interconnecting lines. In FIG. 6, the non-conducting layer of the double layer separates stacked interconnect lines preventing a short circuit. In an alternate embodiment, conductor/insulator blends can also be used to form the top contact of diodes. Typical diodes include light emitting diodes, rectifying diodes and photodiodes. FIG. 8 shows an example of using an insulator and a conductor blend to form a diode top contact.

In the embodiment shown in FIG. 6, a blend solution of a conducting and an insulating polymer forms interconnect lines between circuit elements. The conducting lines such as line 604 and line 608 interconnect circuit devices, such as circuit devices 612, 616, 620. In the illustrated example of FIG. 6, the circuit devices 612, 616, 620 are thin film transistors for use in a display system, although such an array of thin film transistors may also be commonly used in a sensor system.

One method of forming the structure of FIG. 6 uses a droplet ejection mechanism, such as a jet printer or a piezo-electric print mechanism, to eject droplets of the blend solution. After ejection, the conductor and the insulating polymer segregate. A solvent that carries the conductor and the insulator evaporates leaving behind the conductor overlayed by the insulator. As in the case of a semiconducting and insulating blend solution previously described, several techniques may be used to make sure that the insulator overlays the conductor. Those techniques include selecting a substrate that preferentially wets to the conductor, selecting an insulator that preferentially wets to the conductor or selecting a conductor that has a lower solubility in the solvent than the insulator.

Many different compounds may be used for the conductor, insulating polymer and solvent. Example conductor materials include poly(3,4-ethylene dioxy thiophene) doped with polystyrene sulfonic acid (PEDOT/PSS), polyaniline (PANI), metal nanoparticles (Au, Ag), carbon nanotubes. Example insulating polymers previously identified include poly-(methyl methacrylate) (PMMA), poly(4-vinylphenol) (PVP) and benzocyclobutene (BCB). Typical solvents previously identified include organic solvents such as dichlorobenzene, xylene, chloroform, mesitylene amongst others.

As the solvent evaporates, the conductor forms a conducting line such as line 604 and line 608 connecting electronic devices. When the electronic devices are transistors in a display, the conducting lines may couple sources, drains, and gates of the transistors to a power source, or to a circuit that controls the display. An insulating polymer layer covers and insulates each conducting lines. The insulating polymer protects conducting lines 604 and 608 from environmental damage. The insulating polymer also allows other electronic devices stacked over conducting lines 604, 608, including intersecting conducting lines 624, 628 from short circuiting or otherwise interfering with the current carried in lines 604, 608.

Figure 7:
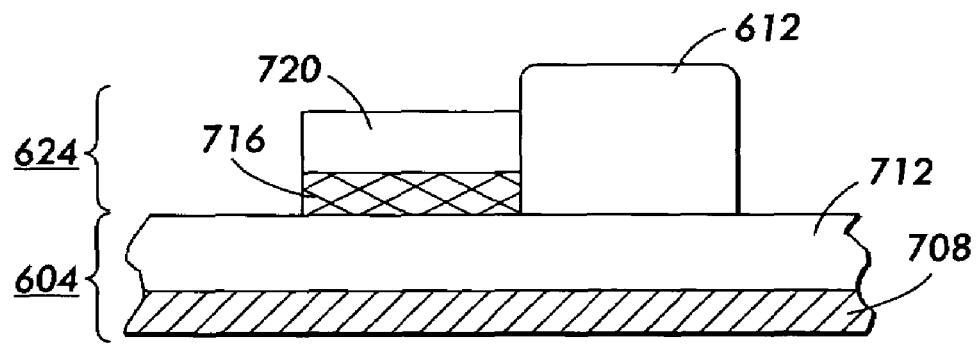
FIG. 7 shows a side cross sectional view of the intersection between two intersecting interconnect lines.

FIG. 7 shows a cross sectional side view of an example intersection of conducting lines such as intersection 650 of FIG. 6. First deposited conducting line 604 includes an insulating layer 712 overlying a conducting layer 708. Insulating layer 712 allows electrical devices to be deposited over the conducting line 604. In the example of FIG. 7, "the electrical device" is another conducting line 654. Conducting line 654 runs perpendicular to conducting line 604.

During formation, conducting line 654 is deposited after the solvent that carried insulating layer 712 has evaporated. Typically, conducting line 654 is also printed with a polymer blend including a solvent, a conductor and an insulator. The solvent used is carefully selected so as not to dissolve previously deposited layers, in particular the solvent should not dissolve insulator 712. Examples of typical solvents including water and alcohol based solvents. Alternately the bottom insulator may be formed from a precursor that is crosslinked during annealing such that it will not dissolve upon exposure to later deposited solvents.

As the solvent evaporates, the polymer blend forms conducting layer 716. Insulating material dissolved in the polymer blend solution forms an insulating layer 720 over the conducting layer. The insulating layer seals conducting layer 716 from environmental damage and also permits subsequent electronic devices to be deposited over conducting line 654.

FIG. 8 shows still another use of a conductor/insulator blend of polymer material. In FIG. 8, a blend solution is used to form an electrical contact to a diode. In one embodiment, the diode is a light emitting diode.

In FIG. 8, a first conductor 804 is deposited over a substrate 800. First conductor 804 may be a metal such as aluminum or copper. A semiconductor 808 deposited over first electrode 804 forms the active region of the diode. The semiconductor outputs lights through a facet, such as facet 808, when electrical energy is injected into the semiconductor.

A second electrical contact or electrode 812 is formed over semiconductor 808. The second electrical contact is deposited in a polymer blend solution that includes a conducting material, an insulating material and a solvent. As the solvent evaporates, the conducting material and insulator segregate and exit solution. The conducting material forms electrode 812. The insulating material forms a protective layer 815. By coupling electrode 812 and first conductor 804 to a power source, semiconductor 808 can be electrically excited to output light.

Many of the presented details are designed to provide examples and facilitate understanding of the invention and various ways the invention can be used. Such details are not meant to, and should not be interpreted to limit the claims. For example, although most of the specification describes how to fabricate a thin film transistor using the described techniques, a large variety of electronic components can be formed using the described technique. Thus the inventions should not be limited by these examples, but only by the claims as presented, the amendments to the claims, and variations, alternatives, modifications, improvements, equivalents, and substantial equivalents of the embodiments described in the claims.

What is claimed is:

1. A method of interconnecting electronic devices comprising:
   locating a first contact of a first electronic device;
   locating a second contact of a second electronic device;
   depositing a blend solution to connect the first contact to the second contact, the blend solution including a first material designed to lead to formation of an insulator and a second material designed to lead to formation of a conductor, wherein the second material is a precursor to a conductor, such that after formation, the conductor forms a first conducting line to carry current from the first electronic device to the second electronic device and the insulator forms a protective layer above the conductor.

2. The method of claim 1 wherein the first material is a liquid solution precursor to an insulator and the second material is a liquid solution precursor to a conductor.

3. The method of claim 2 wherein the precursor to the conductor is a gold nanoparticle solution.

4. The method of claim 1 wherein the insulator precursor is benzocyclobutene.

5. The method of claim 1 wherein the first material is a polymer insulator.

6. The method of claim 1 wherein the insulator is directly over and in contact with the conductor.

7. A method of interconnecting electronic devices comprising:
   locating a first contact of a first electronic device wherein the first electronic device is a thin film transistor;
   locating a second contact of a second electronic device wherein the second electronic device is a thin film transistor; and,
   depositing a blend solution to connect the first contact to the second contact, the blend solution including a first material designed to lead to formation of an insulator and a second material designed to lead to formation of a conductor such that after formation, the conductor forms a first conducting line to carry current from the first electronic device to the second electronic device and the insulator forms a protective layer above the conductor.

8. The method of claim 7 wherein the thin film transistors are two thin film transistors in an array of thin film transistors in a display system.

9. A method of interconnecting electronic devices comprising:
   locating a first contact of a first electronic device;
   locating a second contact of a second electronic device;
   depositing a blend solution by ejecting droplets from a nozzle to connect the first contact to the second contact, the blend solution including a first material designed to lead to formation of an insulator and a second material designed to lead to formation of a conductor such that after formation, the conductor forms a first conducting line to carry current from the first electronic device to the second electronic device and the insulator forms a protective layer over the conductor.

10. The method of claim 9 wherein the ejecting of droplets occurs in a jet printing process.

11. The method of claim 10 wherein a piezoelectric driver is used to eject the droplets from the nozzle.

12. A method of interconnecting electronic devices comprising:
   locating a first contact of a first electronic device;
   locating a second contact of a second electronic device;
   depositing a blend solution to connect the first contact to the second contact, the blend solution including a first material designed to lead to formation of an insulator and a second material designed to lead to formation of a conductor, wherein the second material is a polymer conductor, such that after formation, the conductor forms a first conducting line to carry current from the first electronic device to the second electronic device and the insulator forms a protective layer above the conductor.

13. A method of interconnecting electronic devices comprising:
   locating a first contact of a first electronic device;
   locating a second contact of a second electronic device;
   depositing a blend solution to connect the first contact to the second contact, the blend solution including a first material designed to lead to formation of an insulator and a second material designed to lead to formation of a conductor such that after formation, the conductor forms a first conducting line to carry current from the first electronic device to the second electronic device and the insulator forms a protective layer above the conductor;
   waiting for a solvent to evaporate and the insulator to dry
   depositing a second polymer blend over the insulator, the second polymer blend including a second insulator and a second conductor that segregates to form a second conducting line.

14. The method of claim 13 wherein the second conducting line is electrically isolated from the first conducting line.

15. The method of claim 14 wherein the second conducting line is approximately perpendicular to the first conducting line.

16. The method of claim 15 wherein the second conducing line and the first conducting line are coupled to thin film transistors in a display system.

17. A method of forming a display system including a plurality of thin film transistors on a substrate, the method comprising the operations of:

depositing a first polymer blend solution including a first solvent, a first conductor and a first insulator on said substrate, the polymer blend solution deposited in an approximate line to couple a contact in a first thin film transistor on the substrate to a contact in a second thin film transistor on the substrate; and, waiting for the first polymer blend solution to segregate such that the first conductor is adjacent to the substrate and the first insulator is adjacent the first conductor.

18. The method of claim 17 further comprising:

waiting for the first solvent to evaporate; and, depositing a second polymer blend solution including a second solvent, a second conductor and a second insulator in an approximate line to couple a contact in a third thin film transistor to a contact in a fourth thin film transistor, a region of the approximate line of the second polymer blend solution overlays the first insulator of the first polymer blend solution.

19. The method of claim 17 further comprising:

waiting for the second conductor and the second insulator to segregate such that in the region of overlay, a first side of the second conductor is adjacent the first insulator and a second side of the second conductor is adjacent the second insulator.

20. A method of interconnecting electronic devices on a substrate comprising:

locating a first contact of a first electronic device, the first contact on a surface of the substrate;

locating a second contact of a second electronic device, the second contact on the surface of the substrate such that the first contact and the second contact are in a plane approximately parallel to the surface of the substrate;

depositing a blend solution on the substrate, the blend solution to connect the first contact to the second contact, the blend solution including a first material designed to lead to formation of an insulator and a second material designed to lead to formation of a conductor such that after formation, the conductor forms a first conducting line to carry current from the first electronic device to the second electronic device and the insulator forms a protective layer over the conductor.

21. A method of interconnecting electronic devices comprising:

locating a first contact of a first electronic device;

locating a second contact of a second electronic device;

depositing a liquid blend solution to connect the first contact to the second contact, the liquid blend solution including a first material designed to lead to formation of an insulator and a second material designed to lead to formation of a conductor, the second material including conducting nanoparticles having a dimension less than 1 micrometer such that after formation, the conductor forms a first conducting line to carry current from the first electronic device to the second electronic device and the insulator forms a protective layer over the conductor.

22. A method of interconnecting electronic devices comprising:

locating a first contact of a first electronic device;

locating a second contact of a second electronic device;

depositing a liquid blend solution to connect the first contact to the second contact, the liquid blend solution including a first material designed to lead to formation of an insulator and a second material designed to lead to formation of a conductor, the second material including non-magnetic conducting particles such that after formation, the conductor forms a first conducting line to carry current from the first electronic device to the second electronic device and the insulator forms a protective layer over the conductor.

* * * * *

UNITED STATES PATENT AND TRADEMARK OFFICE
CERTIFICATE OF CORRECTION

| | | |
|---|---|---|
| PATENT NO. | : 7,300,861 B2 | Page 1 of 1 |
| APPLICATION NO. | : 10/875480 | |
| DATED | : November 27, 2007 | |
| INVENTOR(S) | : Ana C. Arias | |

It is certified that error appears in the above-identified patent and that said Letters Patent is hereby corrected as shown below:

In the Specification:

Column 1, line 11, after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*